United States Patent [19]

Macey

[11] 4,224,612
[45] Sep. 23, 1980

[54] MONITORING THE CONDITION OF AN INSULATOR

[76] Inventor: Roy E. Macey, Stand 315, Church St., Johannesburg North, Randburg, Transvaal Province, South Africa

[21] Appl. No.: 905,606

[22] Filed: May 12, 1978

[30] Foreign Application Priority Data

May 12, 1977 [ZA] South Africa .................... 77/2847

[51] Int. Cl.² ............................................. G08B 21/00
[52] U.S. Cl. .................................. 340/647; 174/139; 200/61.08; 340/664; 340/539
[58] Field of Search ............... 340/647, 375, 376, 664; 361/132, 133, 118, 131; 174/139, 140 R, 141 R, 144, 150; 200/61.08, 61.52, 61.83

[56] References Cited

U.S. PATENT DOCUMENTS

| 1,526,770 | 2/1925 | Brain ................................... 340/647 |
| 1,976,378 | 10/1934 | Vrooman ........................ 174/139 X |
| 3,320,524 | 5/1967 | Miller .............................. 340/647 X |

FOREIGN PATENT DOCUMENTS

| 398262 | 7/1924 | Fed. Rep. of Germany ........... 174/139 |
| 1951050 | 7/1971 | Fed. Rep. of Germany ........... 174/139 |
| 1028686 | 5/1966 | United Kingdom .................... 174/139 |

Primary Examiner—John W. Caldwell, Sr.
Assistant Examiner—Daniel Myer
Attorney, Agent, or Firm—Karl W. Flocks

[57] ABSTRACT

A method of continuously monitoring the condition of a power transmission line insulator while it is in service, in which part of the insulator is bypassed by conductive means and in which, when the leakage current passed by the insulator and flowing through the conductive means exceeds a predetermined value, the conductive means is severed by a detonator or other explosive charge and actuating means is actuated which is operative to give a remote indication. Also a sensing and actuating device for use in the method, having conductive means and being adapted to be attached to an insulator so as to bypass part of it, which includes a detonator or other explosive charge adapted to sever the conductive means when leakage current through it exceeds a predetermined value and actuating means in the form of a mercury switch which is operable to give a remote indication when this happens.

11 Claims, 7 Drawing Figures

MONITORING THE CONDITION OF AN INSULATOR

This invention relates to the monitoring of the condition of an electrical power transmission line insulator. More particularly it relates to a method of continuously monitoring the condition of an electrical insulator while in service, and to a sensing and actuating device and to a monitoring installation for use in such method.

According to the invention there is provided a method of continuously monitoring the condition of an electrical power transmission line insulator while it is in service, which method comprises causing the leakage current passed by the insulator to actuate indicating means.

The indicating means may only be actuated when the leakage current exceeds a predetermined value. The predetermined value may be at least 100 mA.

Part of the insulator may be bypassed by conductive means so that the leakage current flows via the conductive means, thereby rendering the bypassed portion of the insulator inoperative; the method further comprising automatically removing the bypass when the leakage current has exceeded said predetermined value, thereby rendering the previously bypassed portion of the insulator operative.

The bypass may be removed by causing the leakage current, when it has reached the predetermined value, to detonate explosive means which is operative to sever the conductive means.

Further according to the invention there is provided a sensing and actuating device for use in monitoring the condition of a power transmission line insulator while it is in service, which device comprises sensing means for sensing leakage current passed by the insulator, and actuating means operable in response to the sensing means to actuate indicating means remote from the insulator when the leakage current has exceeded a predetermined value.

The sensing means may comprise conductive means adapted to be attached to the insulator so as to bypass part of the insulator and carry the leakage current, the conductive means being severable when the leakage current has exceeded said predetermined value.

The device may further comprise an electrically detonatable detonator having a fuse wire which forms part of the conductive means and which is detonatable upon the leakage current passing through the conductive means exceeding said predetermined value.

The device may still further comprise an explosive charge in which the detonator is embedded.

The conductive means may include a pair of conductive tubes which fit together telescopically, thereby establishing electrical contact with one another, and which are closed at their ends remote from one another so as together to define an enclosed space, the detonator being arranged within the enclosed space, and the arrangement being such that, when the detonator is detonated, the explosive force thereof causes the two tubes fly apart, thereby to break electrical contact between them and thus severing said conductive means.

The actuating means may be in the form of an electrical switch, which is switchable when the leakage current has exceeded said predetermined value.

The invention extends to a monitoring installation for continuously monitoring the condition of an electrical power transmission line insulator while it is in service, which installation comprises:
sensing means for sensing leakage current passed by the insulator; and
indicating means remote from the insulator and operable in response to the sensing means to give an indication when the leakage current has exceeded a predetermined value.

The invention will now be described in more detail, by way of example, with reference to the accompanying drawings.

Figure 1:
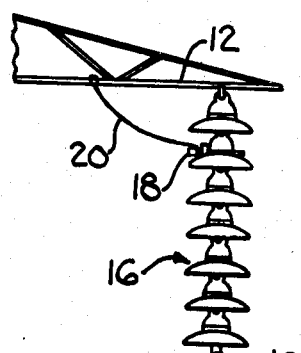
FIG. 1 shows, diagrammatically, part of the cross arm of a power line pylon with a sensing and actuating device in accordance with the invention attached to the insulator string thereof.
Figure 2:
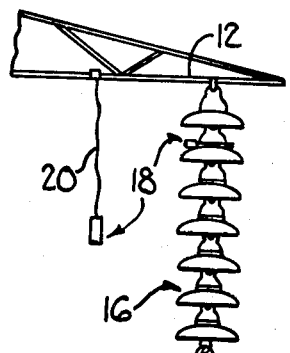
FIG. 2 is similar to FIG. 1 but shows the position of the sensing and actuating device after it has been actuated or triggered.

Referring now to FIGS. 1 and 2 of the drawings, there is shown a power transmission line conductor 10 which is suspended from a cross arm 12 of a power line pylon by means of a multiple shed insulator string 16. Near the top end of the insulator string, spaced from the end, there is mounted a sensing and actuating device 18 which is connected via an electrical connector 20 to the steelwork of the cross member 12, ie to earth.

Figure 3:
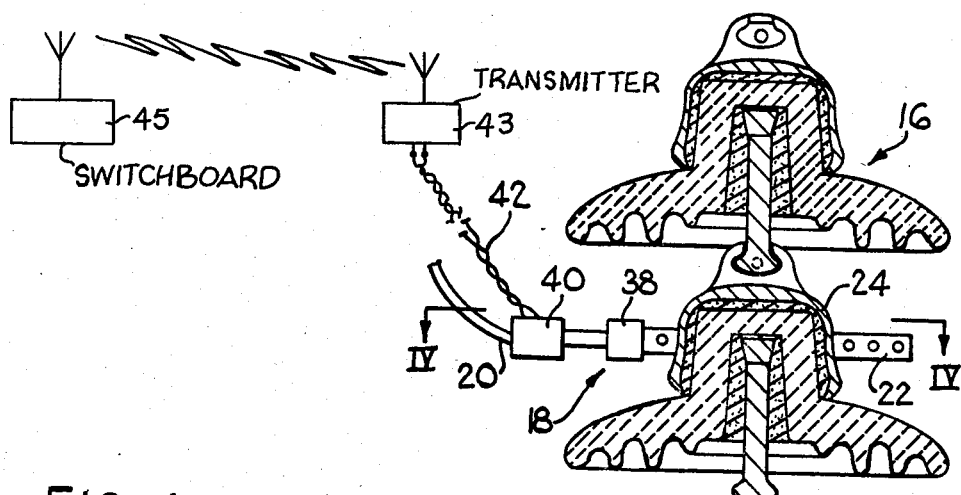
FIG. 3 shows a detail longitudinal cross section of part of the insulator string with the sensing and actuating device attached thereto.
Figure 4:
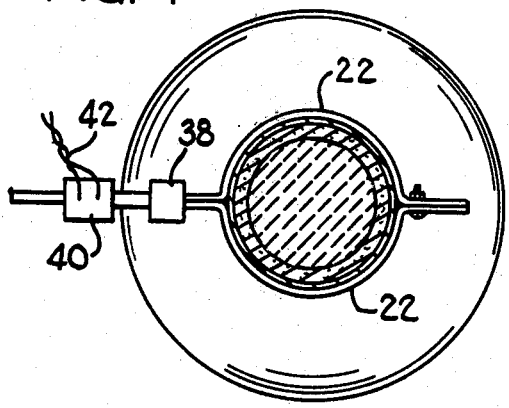
FIG. 4 shows a transverse cross section taken on line IV—IV in FIG. 3.

As can be seen in FIGS. 3 and 4, the sensing and actuating device 18 has attachment means in the form of a bifurcated copper or brass strap 22 whereby it is secured to a metal cap 24 which forms part of the insulator 16. The strap 22 makes electrical contact with the cap 24.

Figure 5:
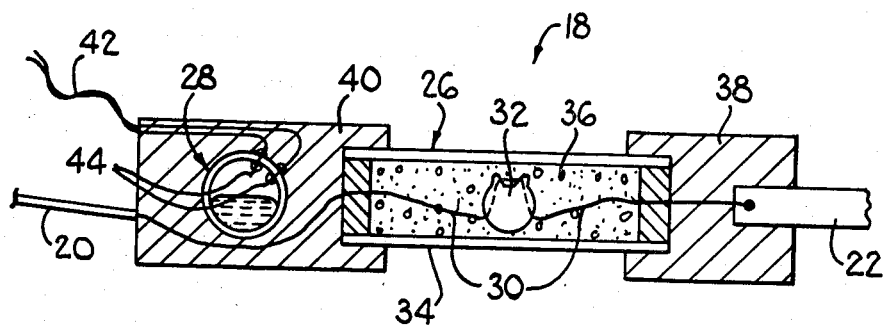
FIG. 5 shows a detail cross section of one form of sensing and actuating device.

Referring now to FIG. 5, the sensing and actuating device 18 comprises an explosive cartridge 26, actuating means in the form of a mercury switch 28, the connector 20, the strap 22 and wires 30 leading from the strap 22 via an electrically detonatable detonator 32 to the connector 20. The explosive cartridge 26 comprises a glass or PVC tube 34 which is filled with an explosive charge 36, the detonator 32 being embedded in the charge. The tube is plugged at each end.

The strap 22, the wires 30, the fuse wire of the detonator 32 (not shown), and the connector 20 form conductive means bypassing the upper part of the insulator string 16, thereby rendering that part of the insulator inoperative.

The strap 22 is secured to one end of the cartridge 26 by means of a block 38 of epoxy resin, and the connector 20 is secured by means of a block 40, also of epoxy resin, to the other end of the cartridge. The mercury switch 28 is embedded in the block 40 and its two leads are indicated by reference numeral 42.

The mercury switch 28 has a pair of electrodes 44 which are arranged such that the switch is open when the actuating device 18 is in the horizontal position, ie when attached to the insulator string 16 as shown in FIG. 1, and closed when the part thereof which is attached to the connector 20 is in the vertical position, ie when suspended from the connector 20 as shown in FIG. 2.

The leads 42 follow the connector 20 and lead down the pylon to a switchboard or the like, which is remote from the insulator 16, where they are connected in series with an electric indicator lamp to a source of electrical power. Thus, when the mercury switch closes, the indicator lamp will light up. The leads 42 may also lead to a small radio transmitter 43 or other signalling device which will be activated when the mercury switch closes, to give an indication at a remote switchboard 45. One of the leads 42 may of course be connected to earth, i.e., to the connector 20, so that a single lead 42 leading to the lamp or the like will suffice.

In use, when the insulator is in a good condition, it will pass very little leakage current from the conductor 10 to the pylon. As the insulator becomes dirty, due, for example, to pollution, the leakage current increases. The connector 20 and the wires 30 via the detonator 32 will effectively bypass the upper portion of the insulator 16 above the point of attachment of the device 18, so that the leakage current will flow to the steelwork of the pylon via the detonator 32. The detonator 32 is selected so that it will detonate at a predetermined current, say, for example, one half to three quarter amp. When the detonator is detonated, it will detonate the explosive charge 36, thereby positively severing the connection between the block 38 with its strap 22 and the block 40. The connector 20 will then drop away as shown in FIG. 2 and cause the mercury switch 28 to close. This will cause the indicator lamp to light up indicating that the insulator needs cleaning. Severing of this connection will also be effective to remove the bypass, thereby effectively increasing the operative length of the insulator. This will allow the insulator to be kept in service for some time until the line has to be taken out of service for some other reason. When the line is out of service the insulator can then be cleaned and the device 18 replaced.

Figure 6:
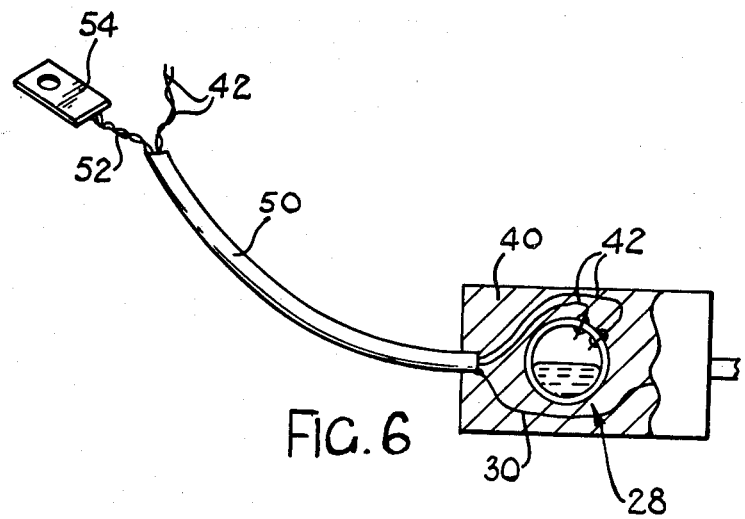
FIG. 6 shows partly in cross section, part of another form of sensing and actuating device.

As a variation, shown in FIG. 6, the connector 20 may be in the form of a copper tube 50 which, at its one end is embedded in the epoxy resin block 40 and at the other end is attachable to the cross-arm 12 via a short length of flexible, braided copper wire 52 and a connecting lug 54. The leads 42 will in this case pass from the switch 28 through the tube 50 to the pylon and thence to the indicator lamp. The tube 50 will shield the leads 42 in the vicinity of the insulator 16.

It will be appreciated that the switch 28 may, depending on the type of alarm circuit used, also be arranged so that it is closed when the device 18 is in the position shown in FIG. 1 and open when in the position shown in FIG. 2.

Figure 7:
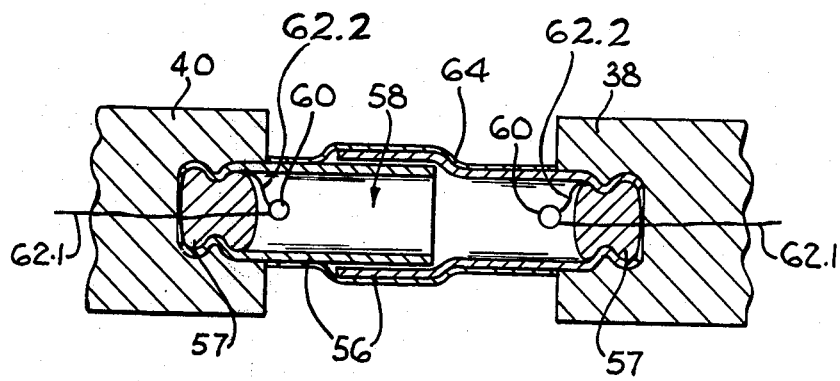
FIG. 7 shows a cross section of part of yet another form of sensing and actuating device.

As a further variation, shown in FIG. 7, the explosive charge 36 is done away with and the glass or PVC tube 34 replaced by two metal tubes 56 which fit together telescopically and frictionally and make electrical contact with one another. The end of each tube 56 remote from the other is plugged by means of an electrically insulative plug 57 and embedded in the respective block of epoxy resin 38, 40. The tubes 56 thus define an enclosed space 58. Within the space 58 there are arranged two detonators 60, instead of only one as in the device of FIG. 5. Also, it does not contain an additional explosive charge 36, the explosive power of the detonators being sufficient for proper operation of the device.

Each detonator 60 has one of its leads 62.1 passing through the respective plug 57 and its other lead 62.2 crimped between the plug and the respective tube 56, thereby to make electrical contact with the tube. The two leads 62.1 are respectively connected to the strap 22 and the connector 20 or tube 50 (see FIGS. 5 and 6).

The two tubes 56 are covered by a plastic sleeve 64 or some other suitable coating so as hermetically to seal the enclosed space 58.

When the leakage current in this embodiment exceeds the predetermined value, the detonators 60 will explode and will cause the two tubes 56 with the blocks 38 and 40 attached thereto to fly apart thus severing the mechanical and electrical connection between the strap 22 and the connector 20 or tube 50. It will be understood that the device illustrated in FIG. 7 will also have a mercury switch 28 embedded in the block 40.

What I claim is:

1. A device for monitoring a condition of power transmission line insulators on a power line pylon comprising an electrically conductive element for connecting to the power line pylon, electrically conductive means for connection to an insulator at a point insulated from the power line pylon, sensing means connected between said electrically conductive element and said electrically conductive means for carrying in a conductive path with said electrically conductive element and said electrically conductive means, substantially all of the leakage current between the insulated point and the pylon to electrically bypass the insulation between the insulated point and the pylon, said sensing means including severing means responsive to the leakage current between the insulated point and the pylon to cause a break between said electrically conductive element and said electrically conductive means when the leakage current exceeds a predetermined value in said conductive path and to render the previously bypassed insulated point and the pylon without a bypass, and indicating means to indicate that the leakage current has exceeded a predetermined value actuated by said severing means moving said electrically conductive element and said electrically conductive means apart.

2. The device of claim 1 further characterized by said severing means including an electrically operable detonator having a fuse wire which forms part of said conductive path, said detonator being detonatable upon the leakage current passing through said conductive path exceeding said predetermined value.

3. The device of claim 2 further characterized by said severing means including an explosive charge in which said detonator is embedded.

4. The device of claim 2 further characterized by said severing means including a pair of conductive tubes which fit together telescopically to establish electrical contact with each other and which are closed at their ends remote from one another so as together to define an enclosed space, said detonator positioned within said enclosed space whereupon when said detonator is detonated, an explosive force causes said two tubes to fly apart, breaking electrical contact between them and thus severing said conductive path.

5. A method of continuously monitoring the condition of an electrical power transmission line insulator while it is in service comprising the steps of bypassing part of the insulator to establish an electrically conductive path between a power line pylon and a point on said insulator insulated from the power line pylon to conduct substantially all of the leakage current through said conductive path, automatically removing the bypass when the leakage current exceeds a predetermined value and rendering the previously bypassed part of the insulator operative as insulation without a bypassing electrically conductive path between said point on the insulator and the pylon, actuating an indicating means to indicate that the leakage current has exceeded said predetermined value.

6. The method of claim 5 further characterized by performing the step of automatically removing the bypass when the leakage current exceeds a predetermined value by detonating explosive means to sever said conductive path.

7. A method as claimed in claim 5, wherein said predetermined value is at least 100 mA.

8. A sensing and actuating device for monitoring the condition of a power transmission line insulator, which device comprises:

an electrically conductive element for connecting to a power line pylon;

electrically conductive means for connection to the insulator, intermediate the ends of the insulator;

sensing means connected between said electrically conductive element and said electrically conductive means for carrying leakage current from the insulator to the pylon and being responsive to such leakage current to cause a break in the connection between the electrically conductive element and the electrically conductive means when the leakage current exceeds a predetermined value, whereby said electrically conductive element will move clear of said electrically conductive means; and actuating means associated with said electrically conductive element for actuating indicating means remote from the pylon when said electrically conductive element has moved clear of the electrically conductive means so as to indicate that the leakage current has exceeded said predetermined value and therefore that the condition of the insulator has fallen below a certain standard.

9. A sensing and actuating device as claimed in claim 8, wherein the actuating means is in the form of a position sensitive switch.

10. A sensing and actuating device as claimed in claim 9, wherein the position sensitive switch is a mercury switch.

11. A sensing and actuating device as claimed in claim 9, which further comprises one or more leads connected to the switch, for connecting the switch to said indicating means; and wherein said electrically conductive element includes a tube of electrically conductive material, said lead or leads passing through the tube.

* * * * *